(12) United States Patent
Fushida et al.

(10) Patent No.: US 8,073,241 B2
(45) Date of Patent: Dec. 6, 2011

(54) DEFECT SOURCE ANALYSIS METHOD, DEFECT SOURCE ANALYSIS APPARATUS, AND METHOD OF MANUFACTURING SEMICONDUCTOR DEVICE

(75) Inventors: Atsuo Fushida, Kawasaki (JP); Yasuo Matsumiya, Kawasaki (JP); Yasuhiro Suzuki, Kawasaki (JP); Akihiro Shimada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 859 days.

(21) Appl. No.: 11/397,852

(22) Filed: Apr. 5, 2006

(65) Prior Publication Data

US 2007/0041631 A1    Feb. 22, 2007

(30) Foreign Application Priority Data

Aug. 18, 2005    (JP) .................................. 2005-237551

(51) Int. Cl.
    *G06K 9/00*    (2006.01)
    *H01L 21/66*    (2006.01)
(52) U.S. Cl. .............................. 382/149; 438/16; 438/17
(58) Field of Classification Search .................. 250/306, 250/307, 310, 311; 438/14, 16, 17; 382/145, 382/149; 324/71.5; 700/110
    See application file for complete search history.

(56) References Cited

U.S. PATENT DOCUMENTS

| 4,213,117 | A | * | 7/1980 | Kembo et al. ................. 382/145 |
| 5,173,719 | A | * | 12/1992 | Taniguchi et al. ............. 356/394 |
| 5,991,699 | A | * | 11/1999 | Kulkarni et al. ................ 702/83 |
| 6,091,846 | A | * | 7/2000 | Lin et al. ........................ 382/145 |
| 6,091,847 | A | * | 7/2000 | Chiu et al. ..................... 382/149 |
| 6,144,584 | A | * | 11/2000 | Kunori et al. ............. 365/185.18 |
| 7,079,966 | B2 | * | 7/2006 | Knoch et al. ..................... 702/81 |
| 7,340,352 | B2 | * | 3/2008 | Takahashi et al. ............... 702/35 |
| 2003/0228050 | A1 | * | 12/2003 | Geshel et al. ................. 382/149 |
| 2004/0218806 | A1 | * | 11/2004 | Miyamoto et al. ............ 382/145 |
| 2005/0109938 | A1 | | 5/2005 | Miyai et al. |

FOREIGN PATENT DOCUMENTS

| JP | 9-312318 | 12/1997 |
| JP | 11-264797 A | 9/1999 |
| JP | 2005-116768 A | 4/2005 |

OTHER PUBLICATIONS

Japanese Office Action dated Apr. 8, 2008, issued in corresponding Japanese Patent Application No. 2005-237551 and partial English translation.

* cited by examiner

*Primary Examiner* — Bhavesh Mehta
*Assistant Examiner* — Barry Drennan
(74) *Attorney, Agent, or Firm* — Fujitsu Patent Center (57) ABSTRACT

An inspecting method increases the accuracy of a DSA (Defect Source Analysis) for thereby increasing the yield of semiconductor devices which are manufactured. For performing a DSA using data of a defect inspecting process obtained when wiring patterns are formed on a wafer and data of a VC (Voltage Contrast) inspecting process performed after the wiring patterns are formed, a rectangular DSA area is established in relation to a wiring pattern in which a nonconductive area is detected, based on the shape of the wiring pattern. For example, if three defects are detected in the defect inspecting process, then it is possible to select only at least one of those defects which affects the wiring pattern in the DSA area. Since fabrication steps can appropriately be evaluated based on the selected defect, suitable actions may be taken for any problematic fabrication step based on the evaluation of the fabrication steps.

16 Claims, 10 Drawing Sheets

DEFECT SOURCE ANALYSIS METHOD, DEFECT SOURCE ANALYSIS APPARATUS, AND METHOD OF MANUFACTURING SEMICONDUCTOR DEVICE

CROSS-REFERENCE TO RELATED APPLICATIONS

This application is based upon and claims the benefits of priority from the prior Japanese Patent Application No. 2005-237551, filed on Aug. 18, 2005, the entire contents of which are incorporated herein by reference.

BACKGROUND OF THE INVENTION (1) Field of the Invention

The present invention relates to an inspecting method, an inspecting apparatus, and a method of manufacturing semiconductor devices, and more particularly to a method of and an apparatus for inspecting samples such as wafers or the like for pattern defects, extraneous deposits, etc., and a method of manufacturing semiconductor devices, which includes a process of inspecting samples such as wafers or the like for pattern defects, extraneous deposits, etc.

(2) Description of the Related Art

In the field of the fabrication of semiconductor wafers, wafers are inspected at suitable stages for pattern defects, extraneous deposits, etc. (simply referred to as "defects") in an effort to provide a stable supply of high-quality semiconductor products.

At present, there have been employed various processes for inspecting samples for defects. Those processes include a dark field (DF) process for irradiating a sample surface with a laser beam and detecting scattered light therefrom, a bright field (BF) process for irradiating a sample surface with light and detecting reflected light therefrom, and a scanning electron microscope (SEM) process for irradiating a sample surface with an electron beam and detecting secondary electrons emitted from the sample surface. Heretofore, there have also been proposed a process of comparing an SEM-generated sample image with a given reference image and detecting any image difference as a defect, and a process of comparing an SEM-generated sample image with a given standard range and detecting an image area out of the standard range as a defect (for details, reference should be made to Japanese laid-open patent publication No. 9-312318).

Still another inspection process is known as a voltage contrast (VC) process for observing an SEM image of a produced wiring pattern for a potential state thereof to check if it suffers electrical defects such as disconnections or the like.

Although each of the various inspection processes referred to above may be carried out alone, it may be combined with another inspection scheme for higher defect detecting accuracy. It has also been attempted to perform a defect source analysis (DSA) on the results of inspections in a plurality of steps of a semiconductor device fabrication process for identifying any fabrication step that is responsible for a defect. If such a defect-causing fabrication step can be hunted down, then it is possible to take an appropriate action to correct the fabrication step for a higher semiconductor device yield.

However, some problems arise out of the DSA as described below.

A DSA using the results of a DF or BF inspecting process performed prior to the formation of a wiring pattern and the results of a VC inspecting process subsequent to the formation of the wiring process will be described below.

Figure 10:
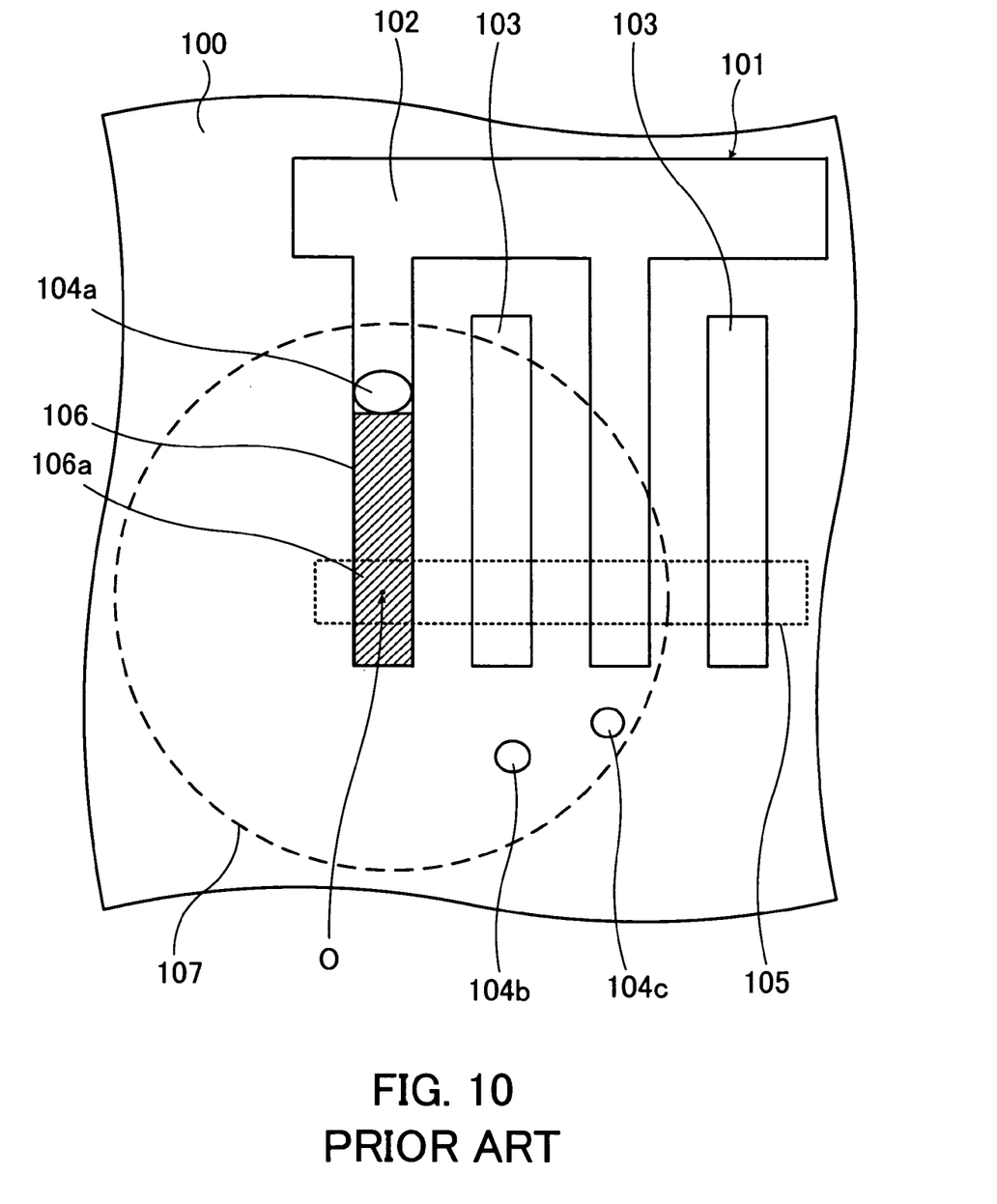
FIG. 10 is a view showing a conventional DSA.

FIG. 10 of the accompanying drawings is illustrative of a conventional DSA.

For forming a TEG (Test Element Group) 101 shaped as shown in FIG. 10 on a wafer 100, fabrication steps of film growth, photolithography, and etching are performed prior to the formation of a combtoothed wiring pattern 102 and isolated wiring patterns 103 according to the Damascene process. After these fabrication steps are carried out, a DF or BF inspecting process is performed. Then, a wiring material is embedded and a CMP (Chemical Mechanical Polishing) process is performed, after which a VC inspecting process is performed.

FIG. 10 shows that three defects 104a, 104b, 104c are detected by the inspecting process performed prior to the formation of the combtoothed wiring pattern 102 and the isolated wiring patterns 103. Of these defects 104a, 104b, 104c, the defect 104a is present in the combtoothed wiring pattern 102 that is finally produced, and the defects 104b, 104c are present in areas other than the combtoothed wiring pattern 102 and the isolated wiring patterns 103 that are finally produced.

In the VC inspecting process performed subsequent to the formation of the combtoothed wiring pattern 102 and the isolated wiring patterns 103, an area (referred to as a VC inspection area) 105 including areas of the combtoothed wiring pattern 102 near its tip ends is observed based on an SEM image thereof while a certain voltage is being applied to the combtoothed wiring pattern 102. Since the potential in an area of the combtoothed wiring pattern 102 which is suffering a disconnection and the potential in an area of the combtoothed wiring pattern 102 which is suffering no disconnection differ from each other, secondary electrons emitted from these different areas have different levels of energy. Consequently, the SEM image of the VC inspection area 105 has a certain contrast difference. The VC inspecting process checks if there is a disconnection or the like or not based on the contrast information of the SEM image.

The VC inspection area 105 does not necessarily require to contain a defect a disconnection or the like therein. Even if a disconnection or the like exists at the base of a tooth of the combtoothed wiring pattern 102, the defect shows its influence on the tooth from the base up to its tip end in the VC inspecting process. Specifically, as shown in FIG. 10, the area extending from the defect 104a in the tooth of the combtoothed wiring pattern 102 to the tip end thereof shows a different level of contrast than the other area, and represents a nonconductive area 106. Actually, the defect 104a has caused the nonconductive area 106 to occur, and the fabrication step which has produced the defect 104a is responsible for the nonconductive area 106. The fact will be made clear by a DSA.

For performing a DSA using the data from the defect inspection prior to the formation of the wiring patterns and the data from the VC inspection subsequent to the formation of the wiring patterns, a circular DSA area 107 is established around the center at the center O of gravity of a nonconductive area 106a that is present in the VC inspection area 105, based on the pattern data of the TEG 101, the circular DSA area 107 being large enough to cover a relatively wide range of the TEG 101. The circular DSA area 107 thus established, however, is likely to reduce the accuracy of the DSA.

Specifically, though only the defect 104a is actually responsible for the occurrence of the nonconductive area 106 in the example shown in FIG. 10, the DSA counts all the defects 104a, 104b, 104c that are present in the DSA area 107 as being responsible for the occurrence of the nonconductive area 106. Even if the defect 104a, i.e., a killer defect, and the defects 104b, 104c, i.e., non-killer defects, are produced in different fabrication steps, the fabrication steps which have actually caused only the non-killer defects to occur are regarded as fabrication steps that have produced killer defects. As a result, the defect-producing fabrication step cannot accurately be identified.

Furthermore, if all the defects 104a, 104b, 104c in the DSA area 107 are regarded as having caused the nonconductive area 106 regardless of the types of those defects 104a, 104b, 104c, then it may become impossible to determine whether the nonconductive area 106 has been caused by an extraneous deposit or a pattern void. This failure is applicable irrespective of whether the defects 104a, 104b, 104c in the DSA area 107 are produced in respective different fabrication steps or in the same fabrication step.

SUMMARY OF THE INVENTION

It is therefore an object of the present invention to provide a method of and an apparatus for inspecting samples for defects highly accurately.

Another object of the present invention is to provide a method of manufacturing semiconductor devices which employs such an inspecting method.

To achieve the former object, there is provided in accordance with the present invention a method of inspecting a sample, comprising the steps of establishing an area on the sample based on the shape of a pattern formed on the sample, and comparing the result of an inspection performed on the sample and the result of another inspection performed on the sample while the pattern is being formed on the sample, with each other in the area.

To achieve the former object, there is also provided in accordance with the present invention an apparatus for inspecting a sample, comprising establishing an area on the sample based on the shape of a pattern formed on the sample, and comparing the result of an inspection performed on the sample and the result of another inspection performed on the sample while the pattern is being formed on the sample, with each other in the area.

To achieve the latter object, there is provided in accordance with the present invention a method of manufacturing a semiconductor device while inspecting a wafer, comprising the steps of establishing an area on the wafer based on the shape of a pattern formed on the wafer, and comparing the result of an inspection performed on the wafer and the result of another inspection performed on the wafer while the pattern is being formed on the wafer, with each other in the area.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

An embodiment of the present invention which is applied to a defect inspection to be performed when wiring patterns are formed on a wafer will be described in detail below with reference to the drawings.

Figure 1:
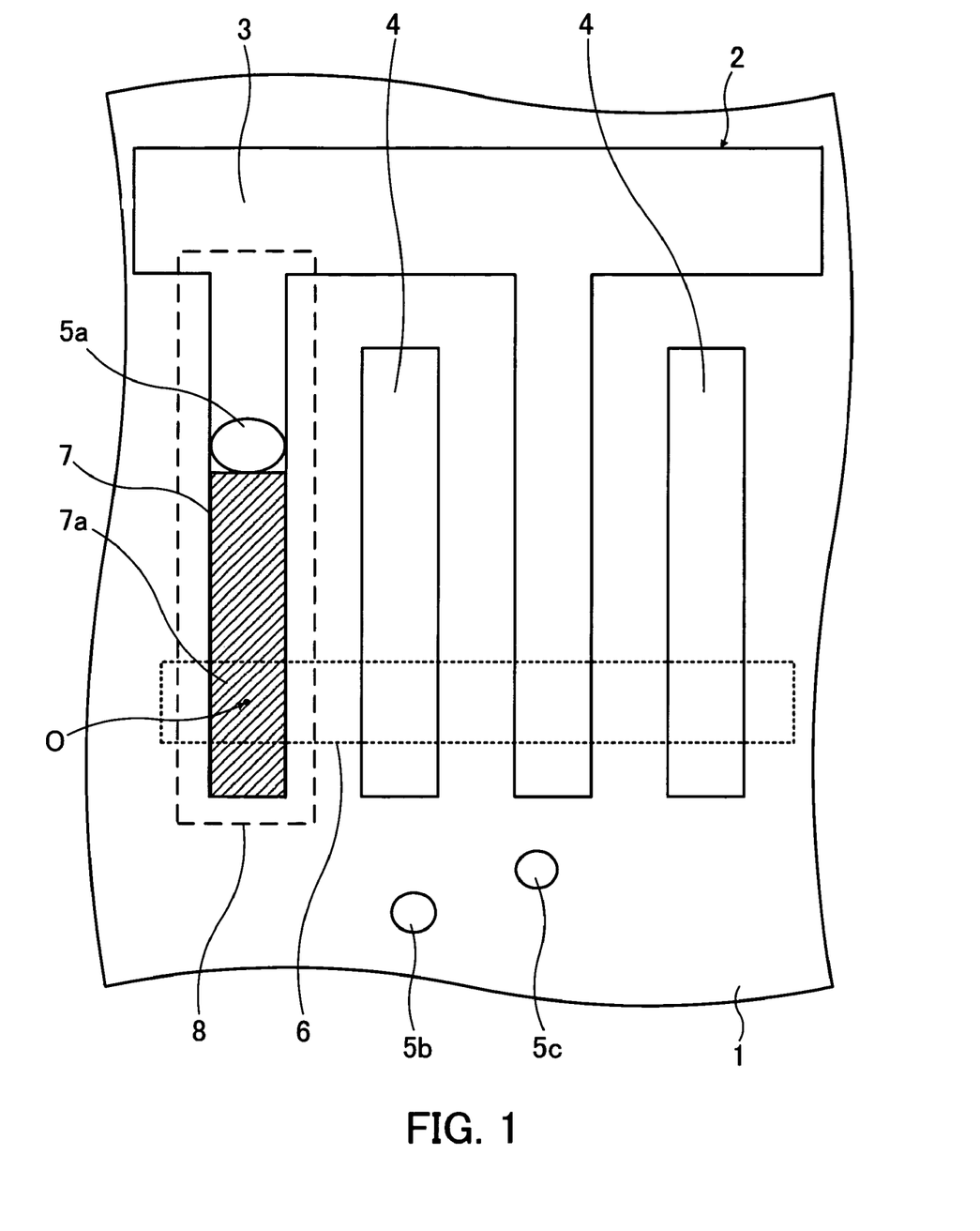
FIG. 1 is a view showing the conception of an example of defect inspection.
Figure 2:
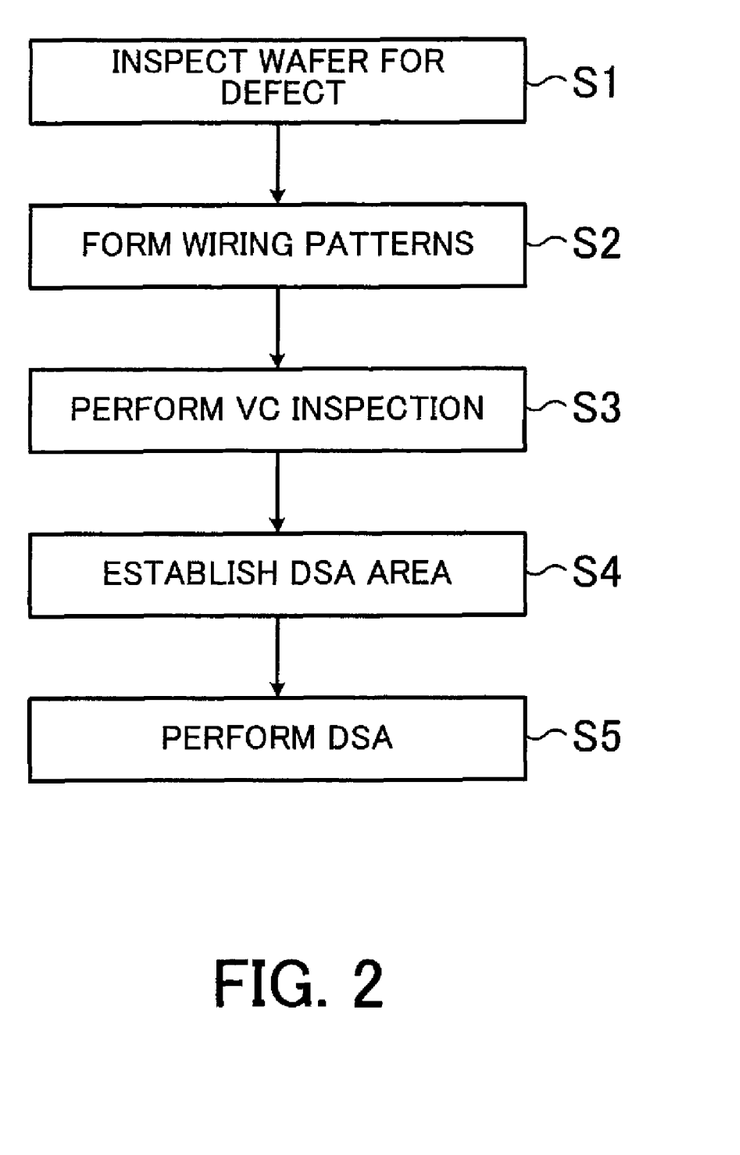
FIG. 2 is a flowchart of a sequence of defect inspection.
Figure 3:
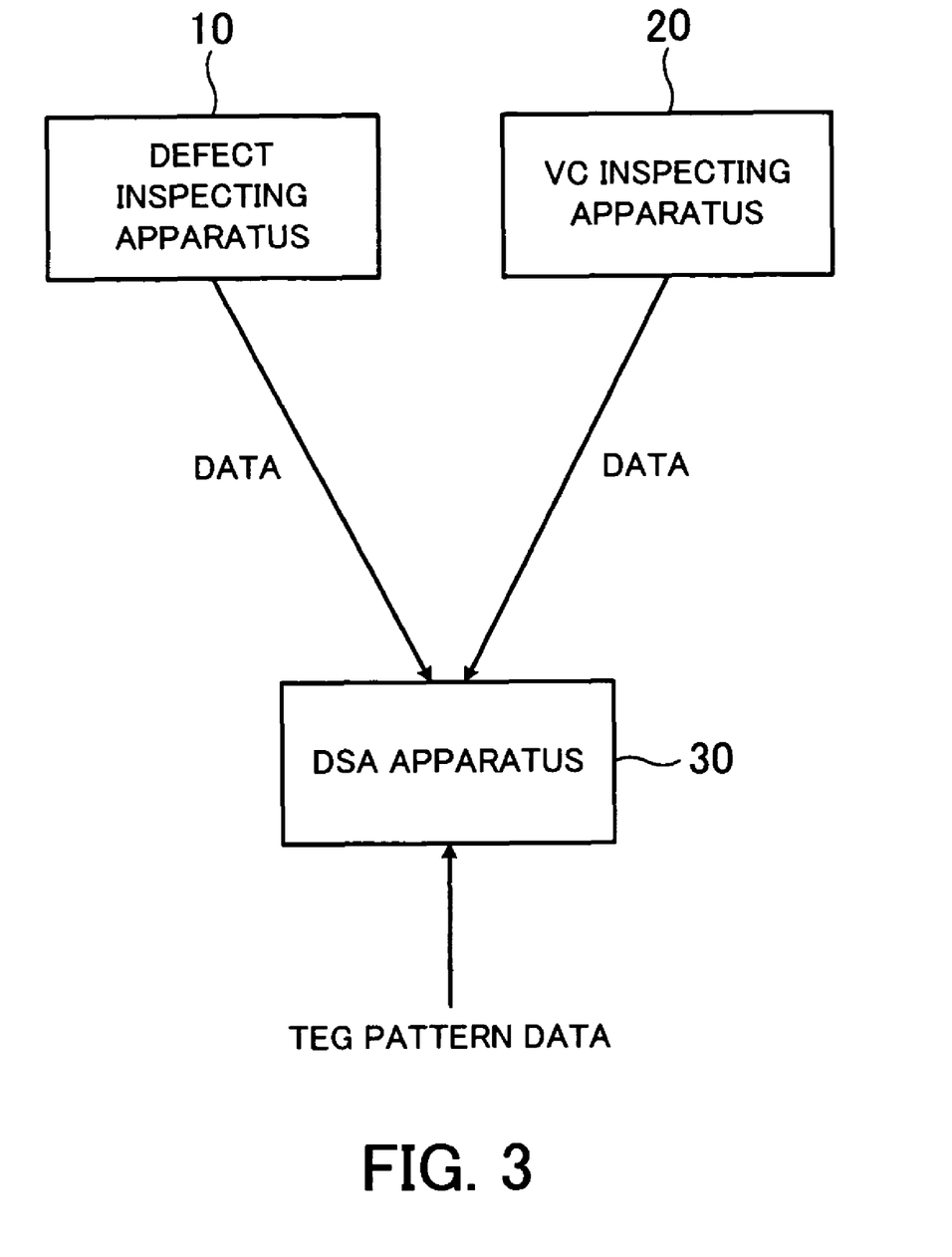
FIG. 3 is a block diagram of a defect inspection system.

FIG. 1 is a view showing the conception of an example of defect inspection, FIG. 2 is a flowchart of a sequence of defect inspection, and FIG. 3 is a block diagram of a defect inspection system. FIG. 1 shows a superposition of the results of a plurality of defect inspections to be described later.

A defect inspection on a. TEG 2 formed on a wafer 1 will be considered below. The TEG 2 shown in FIG. 1 comprises a combtoothed wiring pattern 3 and isolated wiring patterns 4. It is assumed that each of the combtoothed wiring pattern 3 and the isolated wiring patterns 4 has a width of about 0.1 μm, the combtoothed wiring pattern 3 has teeth each having a length of about 2 mm, and the combtoothed wiring pattern 3 and the isolated wiring patterns 4 have a tooth pitch, i.e., a tooth-to-tooth distance, of about 0.1 μm.

If the Damascene process is employed to form the combtoothed wiring pattern 3 and the isolated wiring patterns 4 on the wafer 1, then it is the usual practice to carry out various fabrication steps including the film growth step of forming an insulating film on the wafer 1, the photolithographic step of patterning a resist for forming interconnections, and the etching step of etching the insulating film using the resist pattern as a mask. The trenches that have been formed in the insulating film by the etching step are filled with an interconnection material, and the interconnection material filled in the trenches is polished by the CMP process to produce the combtoothed wiring pattern 3 and the isolated wiring patterns 4.

Until the combtoothed wiring pattern 3 and the isolated wiring patterns 4 are produced as described above, the wafer 1 is inspected for defects between or after the film growth step, the photolithographic step, and the etching step in step S1 (see FIG. 2).

The inspection in step S1 is a defect inspection according to the DF or BF process. Specifically, the inspection in step S1 serves to obtain information of physical defects of the wafer 1 as to whether extraneous matter such as particles or the like has been deposited on the wafer 1 or not or whether interconnection patterns (trenches) have been formed as designed or not, before the trenches are filled with the interconnection material for forming the combtoothed wiring pattern 3 and the isolated wiring patterns 4.

The inspection in step S1 is carried out by a defect inspecting apparatus 10 (see FIG. 3) depending on the type of the inspection. The defect inspecting apparatus 10 has an inspecting mechanism and a computer, and performs the inspecting process according to a software algorithm that cooperates with the defect inspecting apparatus 10. If the inspection in step S1 detects defects on the wafer 1, then the defect inspecting apparatus 10 generates data (inspected results) such as a map representing the coordinates of the positions of the defects on the wafer 1 or a distribution of the defects on the wafer 1. The generated data is stored in a storage means (a storage unit, a recording medium, or the like) that is normally provided in the defect inspecting apparatus 10. Alternatively, the generated data is transmitted to a DSA apparatus 30, to be described later, where the data is stored in a storage means (a storage unit, a recording medium, or the like) that is normally provided in the DSA apparatus 30.

In the example shown in FIG. 1, the defect inspecting apparatus 10 detects three defects 5a, 5b, 5c on the wafer 1. Of these defects 5a, 5b, 5c, the defect 5a is present in the combtoothed wiring pattern 3 that is finally produced, and the defects 5b, 5c are present in areas other than the combtoothed wiring pattern 3 and the isolated wiring patterns 4 that are finally produced.

In the inspection in step S1, if necessary, the wafer 1 is inspected or reviewed by a SEM to acquire SEM images of the wafer 1 at the coordinates of the positions of the defects 5a, 5b, 5c.

After step S1, the combtoothed wiring pattern 3 and the isolated wiring patterns 4 are formed according to the procedure described above in step S2. After the combtoothed wiring pattern 3 and the isolated wiring patterns 4 have been produced, they are inspected by a VC inspecting process in step S3.

In the VC process in step S3, as shown in FIG. 1, a VC inspection area 6 including areas of the combtoothed wiring pattern 3 near its tip ends is observed based on an SEM image thereof while a certain voltage is being applied to the combtoothed wiring pattern 3. The VC inspection area 6 is inspected to check if there is an electrical defect such as a disconnection, a short circuit, or the like or not based on any contrast difference in the SEM image.

The VC inspecting process is carried out by a VC inspecting apparatus 20 (see FIG. 3) that is equipped with a SEM. The VC inspecting apparatus 20 has, in addition to the SEM, an inspecting mechanism and a computer, and performs the VC inspecting process according to a software algorithm that cooperates with the VC inspecting apparatus 20. If a contrast anomaly is detected in the VC inspection area 6, then the VC inspecting apparatus 20 generates data (inspected results) such as a map representing the coordinates of the positions of the defect on the wafer 1 or a distribution of the defect on the wafer 1. The generated data is stored in a storage means (a storage unit, a recording medium, or the like) that is normally provided in the VC inspecting apparatus 20. Alternatively, the generated data is transmitted to the DSA apparatus 30 where the data is stored in the storage means (a storage unit, a recording medium, or the like) that is normally provided in the DSA apparatus 30.

In the example shown in FIG. 1, the area extending from the defect 5a in the tooth of the combtoothed wiring pattern 3 to the tip end thereof shows a different level of contrast than the other area, and represents a nonconductive area 7. In the VC inspecting process, the VC inspecting apparatus 20 only obtains data in the viewing field of the SEM, i.e., data about a nonconductive area 7a in the VC inspection area 6.

The VC inspection area 6 that is established for the VC inspecting process is usually of a size which is large enough to cover, in one image, one to several tens of teeth of the combtoothed wiring pattern 3, each having a width of about several hundreds μm, depending on the size of the TEG 2 and the performance capability of the SEM used. The VC inspection area 6 is established to include the areas near the tip ends of the teeth of the combtoothed wiring pattern 3 because even if a disconnection or the like exists at the base of a tooth of the combtoothed wiring pattern 3, the defect shows its influence on the tooth from the base up to its tip end in the VC inspecting process. Consequently, for inspecting the combtoothed wiring pattern 3 for disconnections or other defects, it is enough to inspect the contrast of the SEM image in the areas of the combtoothed wiring pattern 3 near its tip ends.

Thereafter, a DSA is performed on the data from the defect inspecting apparatus 10 and the data from the VC inspecting apparatus 20 in order to check the relationship between the defects 5a, 5b, 5c which have been detected prior to the formation of the combtoothed wiring pattern 3 and the isolated wiring patterns 4 and the nonconductive area 7a detected in the VC inspecting process subsequent to the formation of the combtoothed wiring pattern 3 and the isolated wiring patterns 4. The DSA is performed by a DSA apparatus 30 (see FIG. 3) comprising a computer, for example, according to a software algorithm that cooperates with the DSA apparatus 30.

The DSA apparatus 30 establishes a DSA area 8 based on the shape of the combtoothed wiring pattern 3 in which the nonconductive area 7a has been found in the VC inspecting process, using the data obtained in steps S1, S3 and the pattern data of the TEG 2, in step S4. Then, the DSA apparatus 30 performs the DSA in the established DSA area 8 in step S5.

A process of establishing the DSA area 8 in step S4 will be described below.

Figure 4:
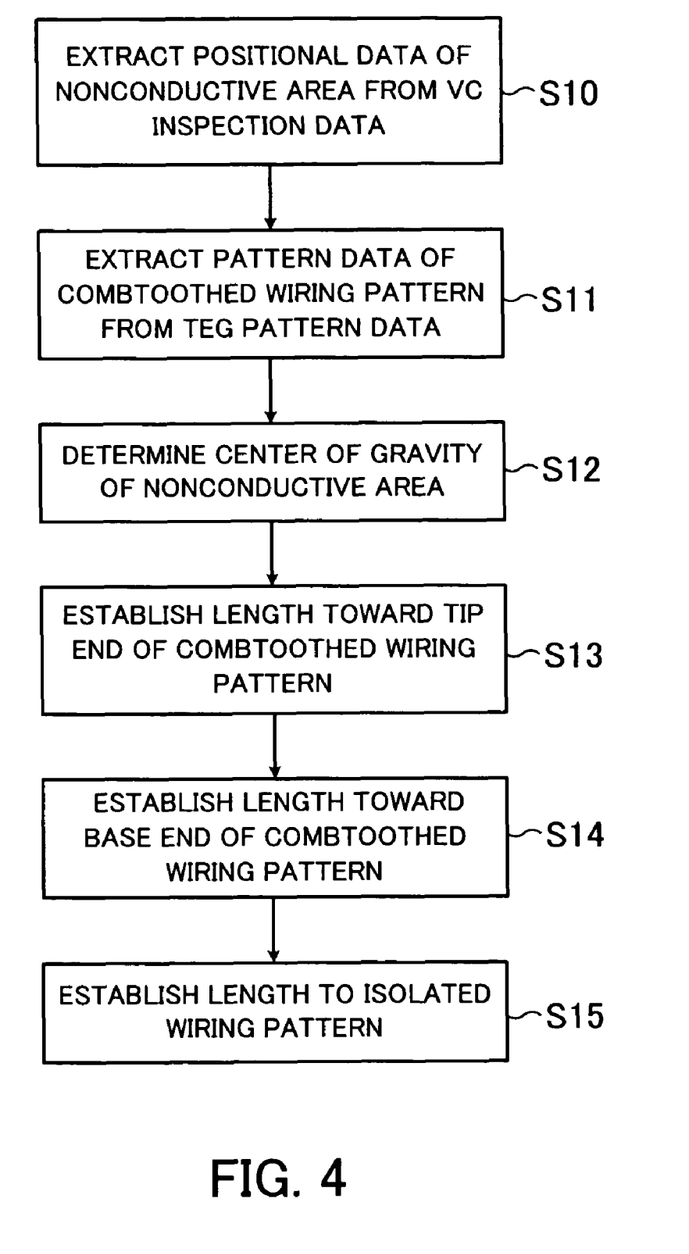
FIG. 4 is a flowchart of a sequence of establishing a DSA area.

FIG. 4 is a flowchart of a sequence of establishing a DSA area.

For establishing the DSA area 8, the DSA apparatus 30 extracts data representing the position of the nonconductive area 7a detected in the VC inspection area 6, from the data produced by the VC inspecting process, in step S10.

Using the extracted positional data of the nonconductive area 7a, the DSA apparatus 30 extracts pattern data of the combtoothed wiring pattern 3 where the nonconductive area 7a is present, from the pattern data of the TEG 2, in step S11.

Then, using the positional data of the nonconductive area 7a the DSA apparatus 30 determines the center O of gravity of the nonconductive area 7a in step S12. Thereafter, the DSA apparatus 30 establishes lengths in the longitudinal and transverse directions of the tooth of the combtoothed wiring pattern 3 where the nonconductive area 7a is present, with respect to the center O of gravity used as a base point.

Specifically, the DSA apparatus 30 establishes a length in a longitudinal direction from the center O of gravity to the tip end of the tooth of the combtoothed wiring pattern 3 where the nonconductive area 7a is present, the length being greater than the distance between the center O of gravity and the tip end of the tooth of the combtoothed wiring pattern 3, in step S13. The length is set to about 0.1 μm, for example, though it depends on the position of the VC inspecting area 6.

Then, the DSA apparatus 30 establishes a length in a longitudinal direction from the center O of gravity to the base of the tooth of the combtoothed wiring pattern 3 where the nonconductive area 7a is present, the length being long enough to cover all the portion of the tooth from the center O of gravity to the base thereof, in step S14.

Thereafter, the DSA apparatus 30 establishes a length in a transverse direction from the center O of gravity to the isolated wiring pattern 4 which is positioned adjacent to the tooth of the combtoothed wiring pattern 3 where the nonconductive area 7a is present, in step S15. Specifically, the length is set to a value equal to or smaller than one-half of the distance from an edge of tooth of the combtoothed wiring pattern 3 to a confronting edge of the adjacent isolated wiring pattern 4, i.e., one-half of the pitch of the combtoothed wiring pattern 3 and the isolated wiring patterns 4. For example, if each of the combtoothed wiring pattern 3 and the isolated wiring patterns 4 has a width of about 0.1 μm, and the pitch of the combtoothed wiring pattern 3 and the isolated wiring patterns 4 is about 0.1 μm, then the length is set to about 0.05 μm or less from the edge of tooth of the combtoothed wiring pattern 3, i.e., about 0.1 μm or less from the center O of gravity. However, the DSA apparatus 30 may establish the length in the transverse direction in view of the coordinate accuracy and coordinate reproducibility of the defect inspecting apparatus 10 and the VC inspecting apparatus 20. The lengths thus established may possibly fail for defects to be present in the DSA area 8. In this case, the DSA apparatus 30 may establish lengths again in the longitudinal and transverse directions.

In steps S13, S14, and S15, lengths are established in the longitudinal and transverse directions to set the rectangular DSA area 8.

In step S14, as described above, the length established by the DSA apparatus 30 in the longitudinal direction is long enough to cover all the portion of the tooth of the combtoothed wiring pattern 3 where the nonconductive area 7a is present from the center O of gravity to the base thereof. However, the DSA apparatus 30 may established a length covering only a portion of the tooth of the combtoothed wiring pattern 3 where the nonconductive area 7a is present. If such a length is established, then since the DSA area 8 is reduced, the subsequent DSA process can be speeded up. The length thus established may possibly fail for defects to be present in the DSA area 8. In this case, the DSA apparatus 30 may establish a length again in the longitudinal direction.

After the DSA apparatus 30 has established the DSA area 8, it performs the DSA in step S5 shown in FIG. 2. The DSA apparatus 30 compares the data in the DSA area 8 among the data produced by the inspecting process carried out prior to the formation of the combtoothed wiring pattern 3 and the isolated wiring patterns 4, and the data in the DSA area 8 among the data produced by the VC inspecting process carried out subsequent to the formation of the combtoothed wiring pattern 3 and the isolated wiring patterns 4, with each other. Therefore, the DSA area 8 serves as an area where the data produced by those inspecting processes are to be compared with each other. According to the DSA, it becomes apparent that the nonconductive area 7 is caused by the defect 5a that is present in the DSA area 8. Stated otherwise, the DSA apparatus 30 judges that the defect 5a is a killer defect for the nonconductive area 7, but the defects 5b, 5c are non-killer defects for the nonconductive area 7.

Heretofore, it has been the customary practice to set the DSA area to a relatively large circular area having a radius of about several millimeters around the center O of gravity of the nonconductive area 7a (see FIG. 10). Therefore, if all the defects 5a, 5b, 5c are contained in the circular DSA area, then the steps that have caused those defects 5a, 5b, 5c are regarded as steps that have produced the nonconductive area 7.

In the defect inspection according to the present embodiment, the DSA area 8 is established as a rectangular area much narrower than the conventional DSA area, based on the shape of an interconnection pattern where the nonconductive area 7a is present. Consequently, the step which has caused the defect 5a prior to the formation of the interconnections can be concluded as the step which has produced the nonconductive area 7 subsequent to the formation of the interconnections. The steps that have caused the defects 5b, 5c which are actually not related to the generation of the nonconductive area 7 are not regarded as the steps that have produced the nonconductive area 7. Therefore, it is possible to accurately count the number of killer defects in each of the steps prior to the formation of the interconnections and to appropriately evaluate each of the steps, so that the DSA is of increased accuracy.

Furthermore, since it is also possible to determine which one of the defects 5a, 5b, 5c that have occurred in one step is a killer defect, the number of killer defects caused in that step can accurately be counted for appropriately evaluating the step.

If each of the steps is evaluated with respect to a plurality of wafers, then those steps which tend to produce killer defects can be identified. With respect to those identified steps, the type of each killer defect, whether an extraneous deposit or a pattern defect, is identified based on an SEM image of the killer defect, and necessary actions or countermeasures such as changed processing conditions or fabrication apparatus maintenance may be taken based on the identified type for an increased yield of semiconductor devices.

Examples of applications of the defect inspection according to the present embodiment will be described below.

A first example will be described below.

Figure 5:
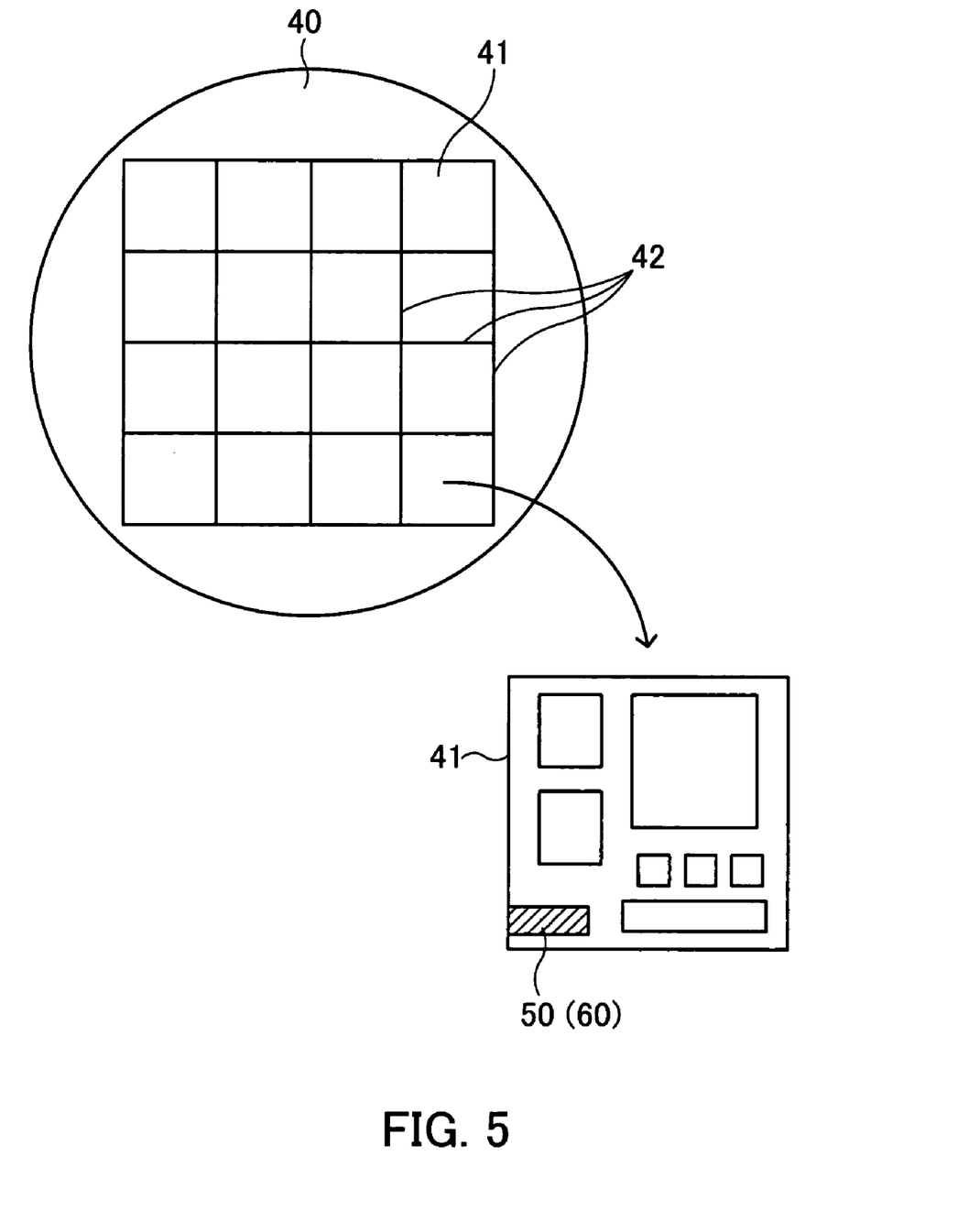
FIG. 5 is a plan view of a wafer and chips.
Figure 6:
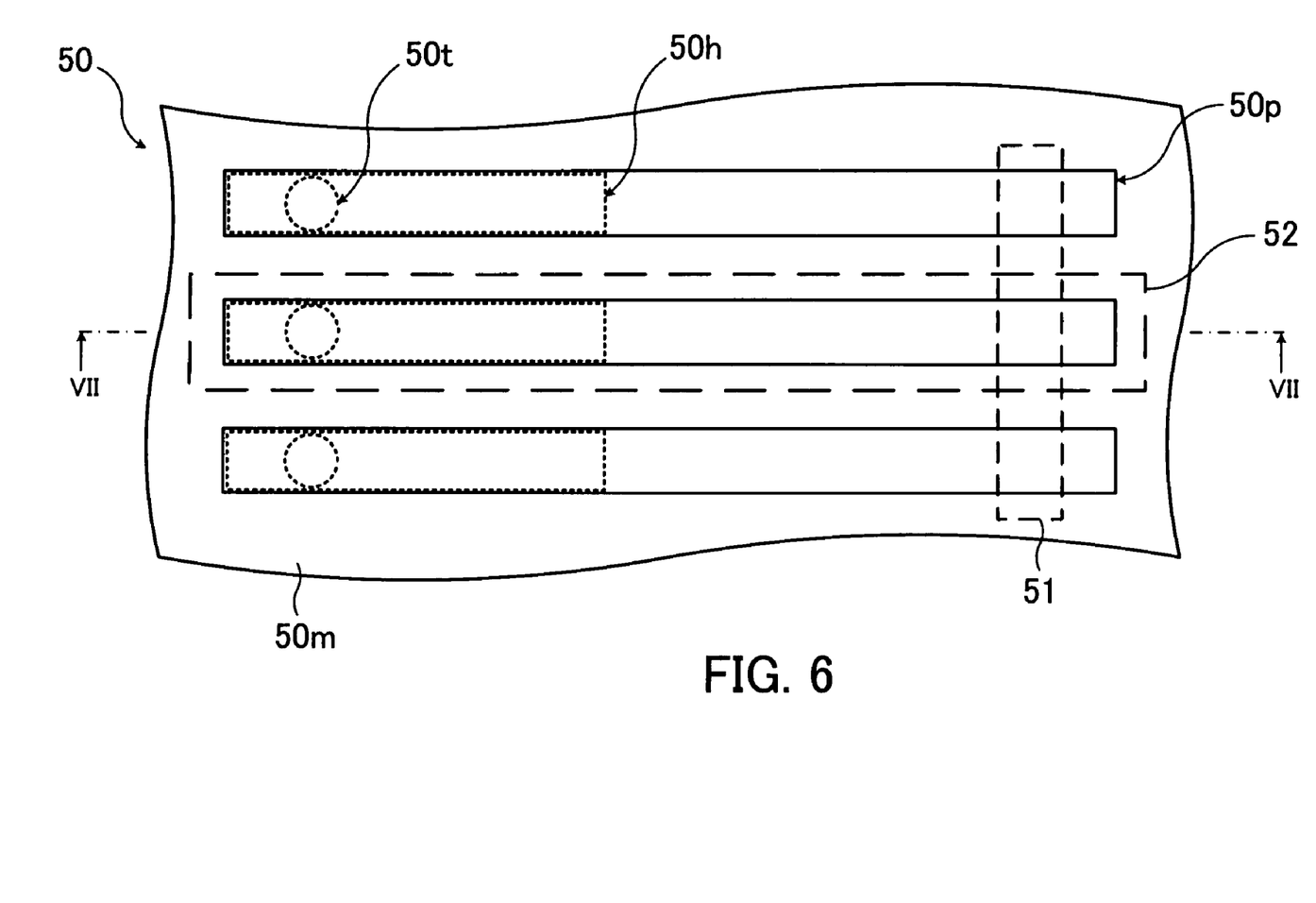
FIG. 6 is a plan view of an inspection pattern according to a first example.
Figure 7:
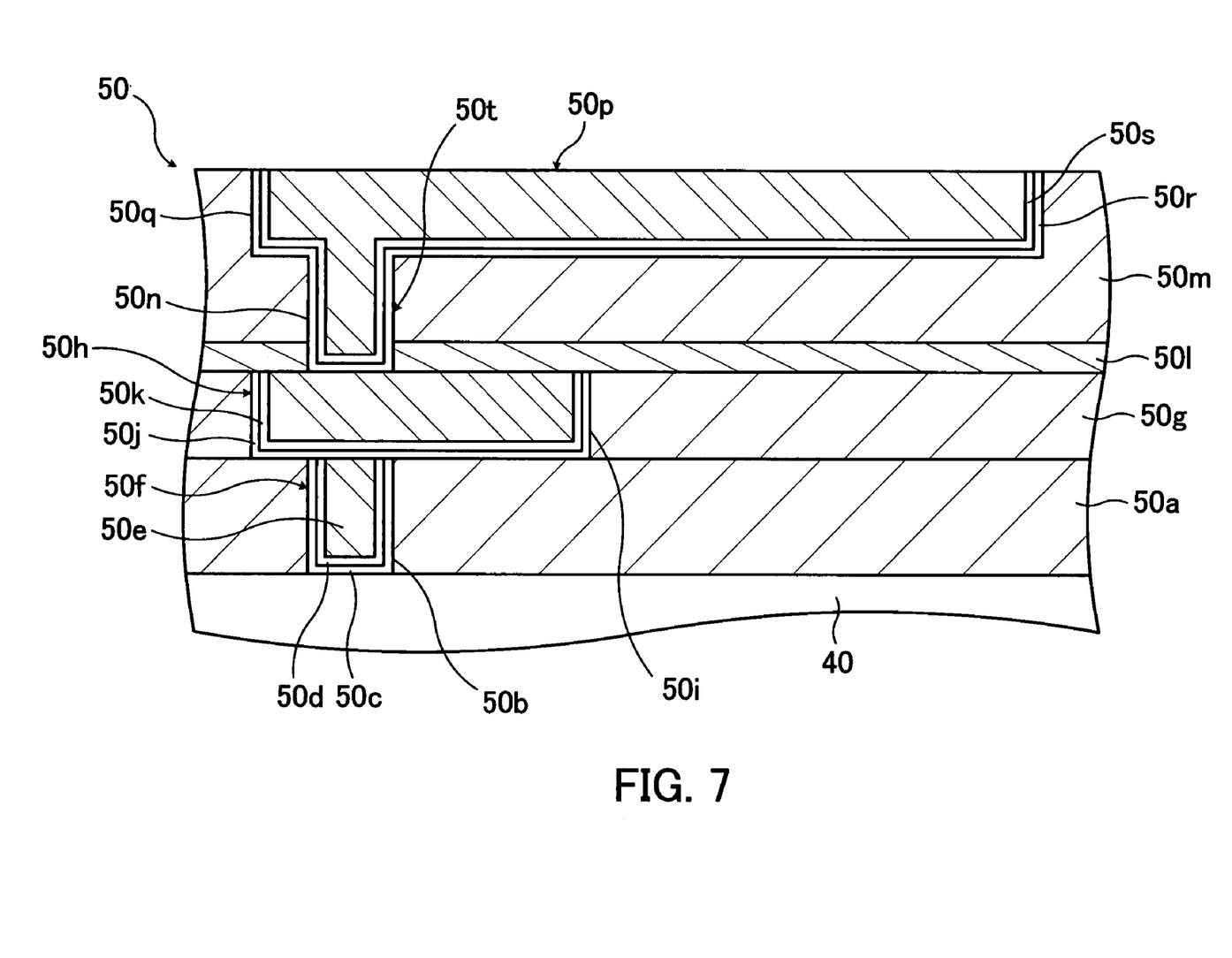
FIG. 7 is a cross-sectional view of the inspection pattern according to the first example.

FIG. 5 shows in plan a wafer and chips, FIG. 6 shows in plan an inspection pattern according to the first example, and FIG. 7 shows in cross section the inspection pattern according to the first example. FIG. 7 is taken along line VII-VII of FIG. 6.

As shown in FIG. 5, a wafer 40 has a plurality of chips 41 formed thereon. Each of the chips 41 is defined by dicing lines 42. The wafer 40 will finally be diced along the dicing lines 42 into the individual chips 41.

Each of the chips 41 on the wafer 40 contains major semiconductor devices and an inspection pattern 50. The inspection pattern 50 may be a linear pattern as shown in FIGS. 6 and 7. For example, the inspection pattern 50 is produced as follows:

As shown in FIG. 7, a silicon oxide ($SiO_2$) film 50a is deposited to a thickness of about 750 μm on the wafer 40 with semiconductor devices (including those completed and those during formation but not yet completed) disposed thereon.

Then, to form a contact hole 50b leading to the wafer 40 in the $SiO_2$ film 50a, a resist film is deposited on the $SiO_2$ film 50a and then patterned by photolithography. Using the patterned resist film as a mask, the $SiO_2$ film 50a is dry-etched to form the contact hole 50b therein.

After the contact hole 50b is formed, the patterned resist film is removed, and a titanium (Ti) film 50c having a thickness of about 10 nm and a titanium nitride (TiN) film 50d having a thickness of about 10 nm are deposited on the $SiO_2$ film 50a and in the contact hole 50b. Thereafter, a tungsten (W) film 50e having a thickness of about 300 nm is deposited, filling the contact hole 50b.

The films 50c, 50d, 50e on the $SiO_2$ film 50a are removed by CMP until the $SiO_2$ film 50a is exposed, leaving the Ti film 50c, the TiN film 50d, and the W film 50e only in the contact hole 50b thereby to form a via 50f.

Then, an $SiO_2$ film 50g is deposited to a thickness of about 500 nm on the $SiO_2$ film 50a and the via 50f. To form a lower interconnection pattern 50h, a trench 50i is formed in the $SiO_2$ film 50g by photolithography and dry etching. After the trench 50i is formed, the DF or BF inspecting process is performed.

Thereafter, a tantalum nitride (TaN) barrier film 50j having a thickness of about 10 nm and a seed copper (Cu) film 50k having a thickness of about 10 nm are deposited on the $SiO_2$ film 50g and in the trench 50i by sputtering. Then, a Cu film having a thickness of about 1 μm is deposited by electroplating, filling the trench 50i.

The films 50j, 50k and the Cu film on the $SiO_2$ film 50g are removed by CMP until the $SiO_2$ film 50g is exposed, leaving the plated Cu film, the seed Cu film 50k, and the TaN barrier film 50j only in the trench 50i thereby to form a lower interconnection pattern 50h.

Then, a silicon nitride (SiN) film 501 having a thickness of about 50 nm is deposited on the SiO$_2$ film 50g and the lower interconnection pattern 50h. Thereafter, an SiO$_2$ film 50m having a thickness of about 700 nm is deposited on the SiN film 501. A contact hole 50n is formed in the SiO$_2$ film 50m and the SiN film 501 directly above the lower interconnection pattern 50h by photolithography and dry etching. After the contact hole 50n is formed, the DF or BF inspecting process is performed.

Subsequently, an organic insulating film is applied to fill the contact hole 50n, and a trench 50q for forming an upper interconnection pattern 50p is formed in the SiO$_2$ film 50m by photolithography and dry etching. The organic insulating film which remains in the contact hole 50n is ashed away, and the SiN film 501 on the bottom of the contact hole 50n is etched away, exposing the lower interconnection pattern 50h. Thereafter, the DF or BF inspecting process is performed.

Then, a TaN barrier film 50r having a thickness of about 10 nm and a seed Cu film 50s having a thickness of about 10 nm are deposited on the SiO$_2$ film 50m and in the contact hole 50n and the trench 50q by sputtering. Then, a Cu film having a thickness of about 1 μm is deposited by electroplating, filling the contact hole 50n and the trench 50q. The films 50r, 50s and the seed Cu film on the SiO$_2$ film 50m are removed by CMP until the SiO$_2$ film 50m is exposed, leaving the plated Cu film, the seed Cu film 50s, and the TaN barrier film 50r only in the trench 50q and the contact hole 50n thereby to form an upper interconnection pattern 50p and a via 50t that interconnects the upper interconnection pattern 50p and the lower interconnection pattern 50h.

In this manner, the inspection pattern 50 shown in FIGS. 6 and 7 is formed, together with semiconductor devices, in each of the chips 41 on the wafer 40. After the inspection pattern 50 is formed, the VC inspecting process is performed on a VC inspecting area 51 shown in FIG. 6, for example. For performing a DSA using the results of the DF or BF inspecting process performed in the fabrication of the inspecting pattern 50 and the results of the VC inspecting process, a DSA area 52 as shown in FIG. 6 is established in surrounding relation to one of the lines of the inspection pattern 50, the DSA area 52 having dimensions depending on the length of the line. The DSA area 52 can be established in the same sequence as shown in FIG. 4. Then, the data in the DSA area 52 among the data produced by the inspecting process carried out prior to the formation of the inspection pattern 50, and the data in the DSA area 52 among the data produced by the VC inspecting process carried out subsequent to the formation of the inspection pattern 50 are compared with each other to know whether there is a killer defect or not and to identify a fabrication step which is responsible for a killer defect.

A second example will be described below.

Figure 8:
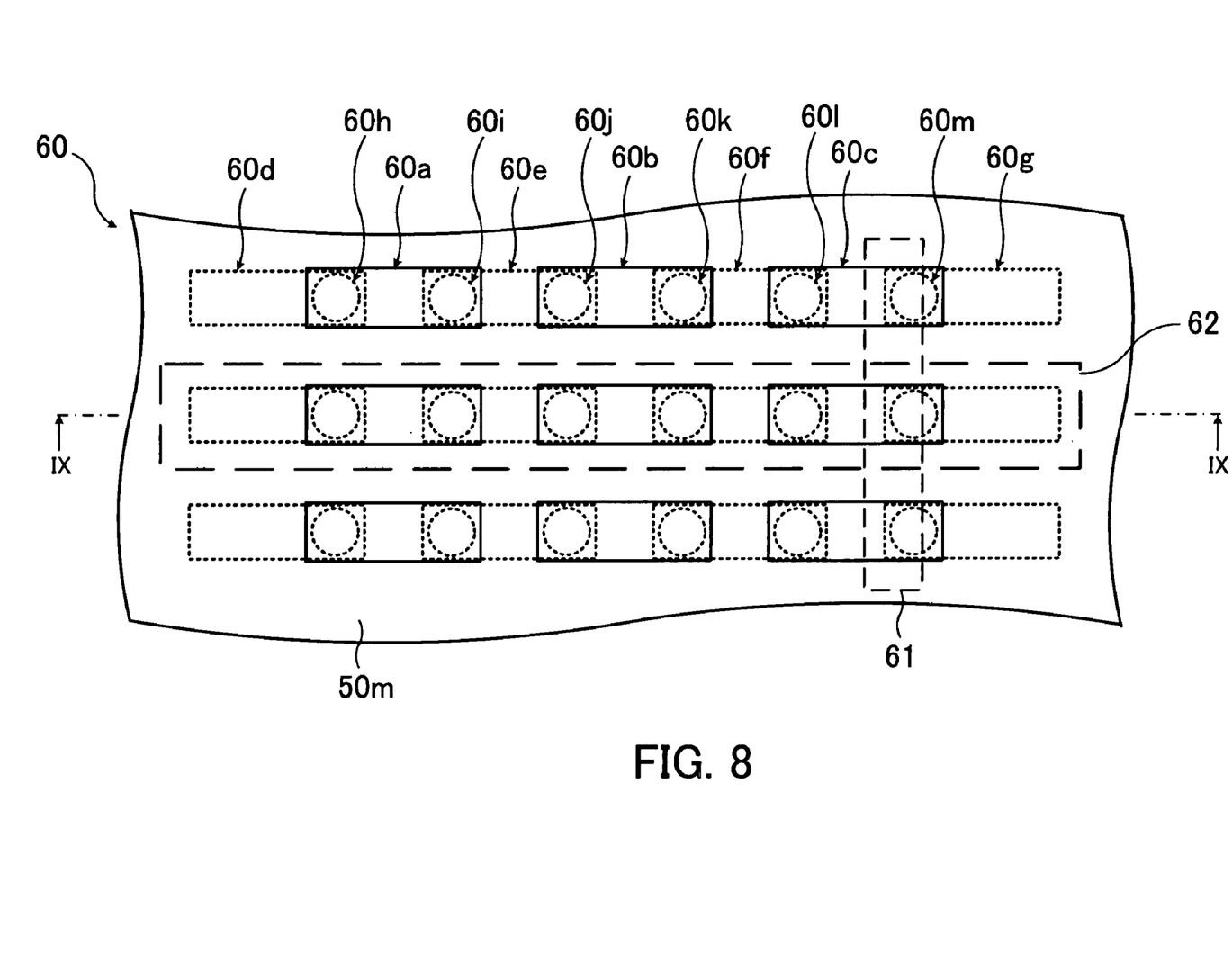
FIG. 8 is a plan view of an inspection pattern according to a second example.
Figure 9:
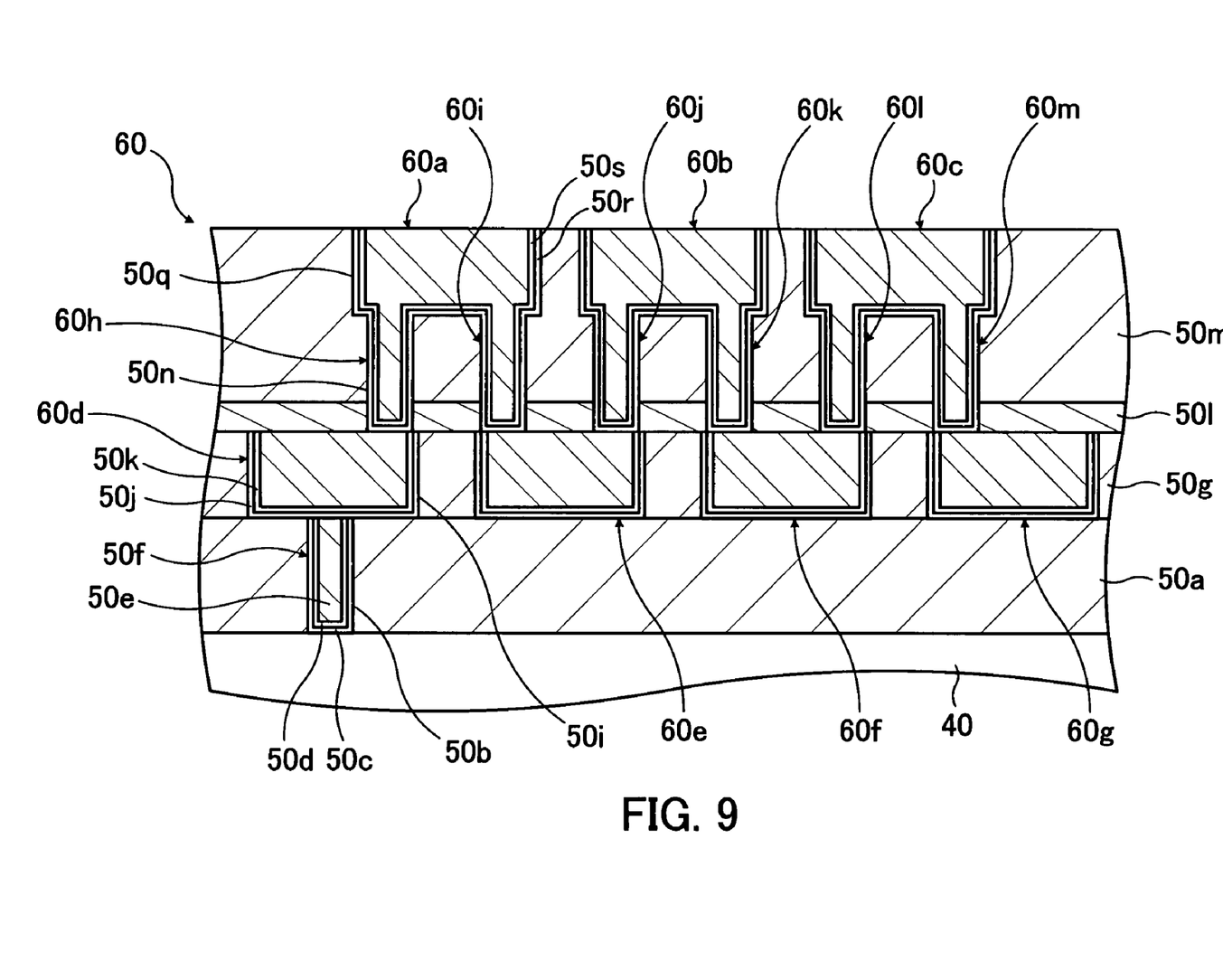
FIG. 9 is a cross-sectional view of the inspection pattern according to the second example.

FIG. 8 shows in plan an inspection pattern according to the second example, and FIG. 9 in cross section the inspection pattern according to the second example. FIG. 9 is taken along line IX-IX of FIG. 8. Those parts shown in FIGS. 8 and 9 which are identical to those shown in FIGS. 6 and 7 are denoted by identical reference characters, and will not be described in detail below.

An inspection pattern 60 shown in FIGS. 8 and 9 is of a via chain structure having upper interconnection patterns 60a, 60b, 60c and lower interconnection patterns 60d, 60e, 60f, 60g which are continuously interconnected by vias 60h, 60i, 60j, 60k, 60l, 60m. Other structural details of the inspection pattern 60 are identical to those of the inspection pattern 50 shown in FIGS. 6 and 7. The inspection pattern 60 is disposed in each of the chips 41 on the wafer 40 shown in FIG. 5, as with the inspection pattern 50.

The inspection pattern 60 is formed in the same manner as the inspection pattern 50 shown in FIGS. 6 and 7 except that, as shown in FIG. 9, the four interconnection patterns 60d through 60g are formed instead of the lower interconnection pattern 50h, the six vias 60h through 60m are formed instead of the via 50t, and the three interconnection patterns 60a through 60c formed instead of the upper interconnection pattern 50p.

In the fabrication of the inspection pattern 60, as with the inspection pattern 50, the DF or BF inspecting process is performed after the trench 50i is formed, after the contact hole 50n is formed, and also after the trench 50q is formed.

After the inspection pattern 60 is formed, the VC inspecting process is performed on a VC inspecting area 61 shown in FIG. 8, for example. For performing a DSA using the results of the DF or BF inspecting process performed in the fabrication of the inspecting pattern 60 and the results of the VC inspecting process, a DSA area 62 as shown in FIG. 8 is established in surrounding relation to one of the via chains of the inspection pattern 60, the DSA area 62 having dimensions depending on the length of the via chain. The DSA area 62 can be established in the same sequence as shown in FIG. 4. Then, the data in the DSA area 62 among the data produced by the inspecting process carried out prior to the formation of the inspection pattern 60, and the data in the DSA area 62 among the data produced by the VC inspecting process carried out subsequent to the formation of the inspection pattern 60 are compared with each other to confirm whether there is a killer defect or not and to identify a fabrication step which is responsible for a killer defect.

In the first and second examples described above, the inspection patterns 50, 60 are formed in each of the chips 41. However, the inspection patterns 50, 60 is not limited to being formed in each of the chips 41, but may be formed in any suitable position on the wafer 40. For example, the inspection patterns 50, 60 may be formed in an area outside of the chip formation area, close to the outer edge of the wafer 40 or in an area of the dicing lines 42. It is possible to perform a DSA with respect to the inspection patterns 50, 60 thus formed.

The inspection patterns 50, 60 according to the first and second examples may be formed on the wafer 40 after semiconductor devices are fabricated in the chips 41, or anytime while semiconductor devices are being fabricated in the chips 41, or concurrently with the fabrication of semiconductor devices in the chips 41.

In the first and second examples described above, the numbers of the elements of the inspection patterns, the materials of those elements, the thicknesses of the films thereof, and the processes by which they are formed are given by way of illustrative example only, and may be changed as desired.

According to the present invention, as describe above, when a DSA is to be performed using the data of various defect inspections in the process of forming a wiring pattern on a wafer, a DSA area is established based on the shape of the wiring pattern, and the data are compared with respect to the DSA area. In this manner, only a defect that is highly likely to affect the wiring pattern in the DSA area is selected to evaluate fabrication steps. It is possible to increase the accuracy of the DSA for appropriately evaluating fabrication steps. Since suitable necessary actions or countermeasures may be taken for any problematic fabrication step based on the evaluation of the fabrication steps, high-performance, high-quality semiconductor devices can be manufactured.

The DSA areas 8, 52, 62 are set to rectangular shapes in the illustrated embodiment. However, the DSA areas 8, 52, 62 are not limited to rectangular shapes, but may be set to a shape depending on the shape of a wiring pattern to be inspected, e.g., a shape extending along the outer periphery of a wiring pattern to be inspected.

According to the present invention, an area in which the results of a plurality of inspections produced in the fabrication of a pattern are compared with each other is established on the basis of the shape of the pattern. Inasmuch as the results of the inspections are compared with each other only in the area which is highly likely to affect the pattern, the pattern can be inspected with higher accuracy. If such a pattern inspection is employed in the fabrication of semiconductor devices, then -each of the fabrication steps can appropriately be evaluated. Suitable necessary actions or countermeasures may be taken for any problematic fabrication step based on the evaluation of the fabrication steps, for manufacturing high-performance, high-quality semiconductor devices.

The foregoing is considered as illustrative only of the principles of the present invention. Further, since numerous modification and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A defect source analysis method comprising:
storing a first result of a first inspection of a wafer, a second result of a second inspection of the wafer and data of a shape of a conductive pattern by a defect source analysis apparatus, the first inspection performed by a first inspecting apparatus before forming the conductive pattern on the wafer and the second inspection performed by a second inspecting apparatus after forming the conductive pattern on the wafer;
establishing a defect source analysis area based on the shape of the conductive pattern by the defect source analysis apparatus; and
comparing the first result and the second result with each other in the defect source analysis area by the defect source analysis apparatus; wherein:
the conductive pattern is an inspection pattern formed in a chip on the wafer and connected to the wafer, and is a combtoothed pattern including a plurality of sub-patterns arranged in one direction that are electrically connected to each other; and
the establishing includes establishing the defect source analysis area that includes only one sub-pattern among the plurality of sub-patterns, wherein the one sub-pattern has a nonconductive area determined from the second result of the second inspection among the plurality of sub-patterns.

2. The defect source analysis method according to claim 1, wherein the defect source analysis area has a rectangular shape surrounding the part or whole of the conductive pattern.

3. The defect source analysis method according to claim 1, wherein the establishing comprises:
establishing the defect source analysis area in view of a shape of another conductive pattern formed in the chip on the wafer together with the conductive pattern.

4. The defect source analysis method according to claim 3, wherein the establishing comprises:
establishing the defect source analysis area, exclusive of the other conductive pattern.

5. The defect source analysis method according to claim 1, wherein the first result comprises at least one physical inspection result obtained before forming the conductive pattern, and the second result comprises an electrical inspection result obtained after forming the conductive pattern.

6. The method according to claim 5, wherein the nonconductive area is determined from the electrical inspection result.

7. A defect source analysis apparatus comprising:
a storage unit configured to store a first result of a first inspection of a wafer, a second result of a second inspection of the wafer and data of a shape of a conductive pattern, the first inspection performed by a first inspecting apparatus before forming the conductive pattern on the wafer and the second inspection performed by a second inspecting apparatus after forming the conductive pattern on the wafer;
a second unit configured to establish a defect source analysis area based on the shape of the conductive pattern stored in the storage unit; and
a third unit configured to compare the first result and the second result with each other in the defect source analysis area established by the second unit; wherein:
the conductive pattern is an inspection pattern formed in a chip on the wafer and connected to the wafer, and is a combtoothed pattern including a plurality of sub-patterns arranged in one direction that are electrically connected to each other; and
the second unit establishes the defect source analysis area that includes only one sub-pattern among the plurality of sub-patterns, wherein the one sub-pattern has a nonconductive area determined from the second result of the second inspection among the plurality of sub-patterns.

8. The defect source analysis apparatus according to claim 7, wherein the defect source analysis area has a rectangular shape surrounding the part or whole of the conductive pattern.

9. The defect source analysis apparatus according to claim 7, wherein the second unit establishes the defect source analysis area in view of a shape of another conductive pattern formed in the chip on the wafer together with the conductive pattern.

10. The defect source analysis apparatus according to claim 9, wherein the second unit establishes the defect source analysis area, exclusive of the other conductive pattern.

11. A method of manufacturing a semiconductor device comprising:
inspecting a wafer by using a defect source analysis apparatus, the inspecting including:
storing a first result of a first inspection of a wafer, a second result of a second inspection of the wafer and data of a shape of a conductive pattern by a defect source analysis apparatus, the first inspection performed by a first inspecting apparatus before forming the conductive pattern on the wafer and the second inspection performed by a second inspecting apparatus after forming the conductive pattern on the wafer;
establishing a defect source analysis area based on the shape of the conductive pattern by the defect source analysis apparatus; and
comparing the first result and the second result with each other in the defect source analysis area by the defect source analysis apparatus; wherein:
the conductive pattern is an inspection pattern formed in a chip on the wafer and connected to the wafer, and is a combtoothed pattern including a plurality of sub-patterns arranged in one direction that are electrically connected to each other; and
the establishing includes establishing the defect source analysis area that includes only one sub-pattern among the plurality of sub-patterns, wherein the one sub-pattern has a nonconductive area determined from the second result of the second inspection among the plurality of sub-patterns.

12. The method of manufacturing a semiconductor device according to claim 11, wherein the defect source analysis area has a rectangular shape surrounding the part or whole of the conductive pattern.

13. The method of manufacturing a semiconductor device according to claim 11, wherein the establishing comprises:
    establishing the defect source analysis area in view of a shape of another conductive pattern formed in the chip on the wafer together with the conductive pattern.

14. The method of manufacturing a semiconductor device according to claim 13, wherein the establishing comprises:
    establishing the defect source analysis area, exclusive of the other conductive pattern.

15. The method of manufacturing a semiconductor device according to claim 11, wherein the first result comprises at least one physical inspection result obtained before forming the conductive pattern, and the second result comprises an electrical inspection result obtained after forming the conductive pattern.

16. The method of manufacturing a semiconductor device according to claim 15, wherein the nonconductive area is determined from the electrical inspection result.

* * * * *